United States Patent [19]

Goo

[11] Patent Number: 5,637,273

[45] Date of Patent: Jun. 10, 1997

[54] METHOD FOR MOLDING OF INTEGRATED CIRCUIT PACKAGE

[75] Inventor: Lee Goo, Seoul, Rep. of Korea

[73] Assignees: Anam Industrial Co., Ltd., Seoul, Rep. of Korea; Amkor Electronics, Inc., Chandler, Ariz.

[21] Appl. No.: 729,540

[22] Filed: Oct. 11, 1996

Related U.S. Application Data

[63] Continuation of Ser. No. 349,237, Dec. 5, 1994, abandoned.

[30] Foreign Application Priority Data

| Nov. 30, 1993 | [KR] | Rep. of Korea | 93-25829 |
| Sep. 7, 1994 | [KR] | Rep. of Korea | 94-22439 |
| Sep. 8, 1994 | [KR] | Rep. of Korea | 94-22625 |

[51] Int. Cl.⁶ .......................... B29C 45/14; B29C 45/17
[52] U.S. Cl. .................. 264/272.15; 264/272.17; 264/276
[58] Field of Search ............... 264/272.15, 272.17, 264/276, 272.13, 272.11, 275; 425/116, 121, 123

[56] References Cited

U.S. PATENT DOCUMENTS

| 3,539,675 | 11/1970 | Hugill | 264/272.11 |
| 4,236,689 | 12/1980 | Hass | 425/116 |
| 4,490,902 | 1/1985 | Eytcheson et al. | 264/272.11 |
| 4,546,951 | 10/1985 | Boschman | 425/121 |
| 5,118,271 | 6/1992 | Baird et al. | 426/116 |
| 5,185,653 | 2/1993 | Switky et al. | 257/729 |
| 5,214,846 | 6/1993 | Asami et al. | 264/272.15 |
| 5,270,262 | 12/1993 | Switky et al. | 437/217 |

FOREIGN PATENT DOCUMENTS

| 62128721A | 11/1985 | Japan . |
| 3-64035A | 3/1991 | Japan . |

*Primary Examiner*—Angela Ortiz
*Attorney, Agent, or Firm*—Skjerven, Morrill, MacPherson, Franklin & Friel; Thomas S. MacDonald

[57] ABSTRACT

Method and device for molding integrated circuit packages using dambarless lead frames are disclosed. The mold dies and the lead frame have means for preventing resin leakage out of the mold dies during the package molding step. The leakage preventing means may comprise a tape put on the leads, an enlarged area sections provided on each lead and notches formed on each lead. The leakage preventing means may comprise projections formed on a lead pressing frame of one of the mold dies. In another embodiment, an auxiliary lead frame, which has a plurality of rectangular openings and will be fixed to a bottom mold die, is used as the resin leakage preventing means. When using the auxiliary lead frame, the dambarless lead frame is laid on the auxiliary lead frame and clamped by a top mold die. The enlarged area sections may be formed on the inner leads exclusively or on both the inner and outer leads.

11 Claims, 17 Drawing Sheets

FIG. 14
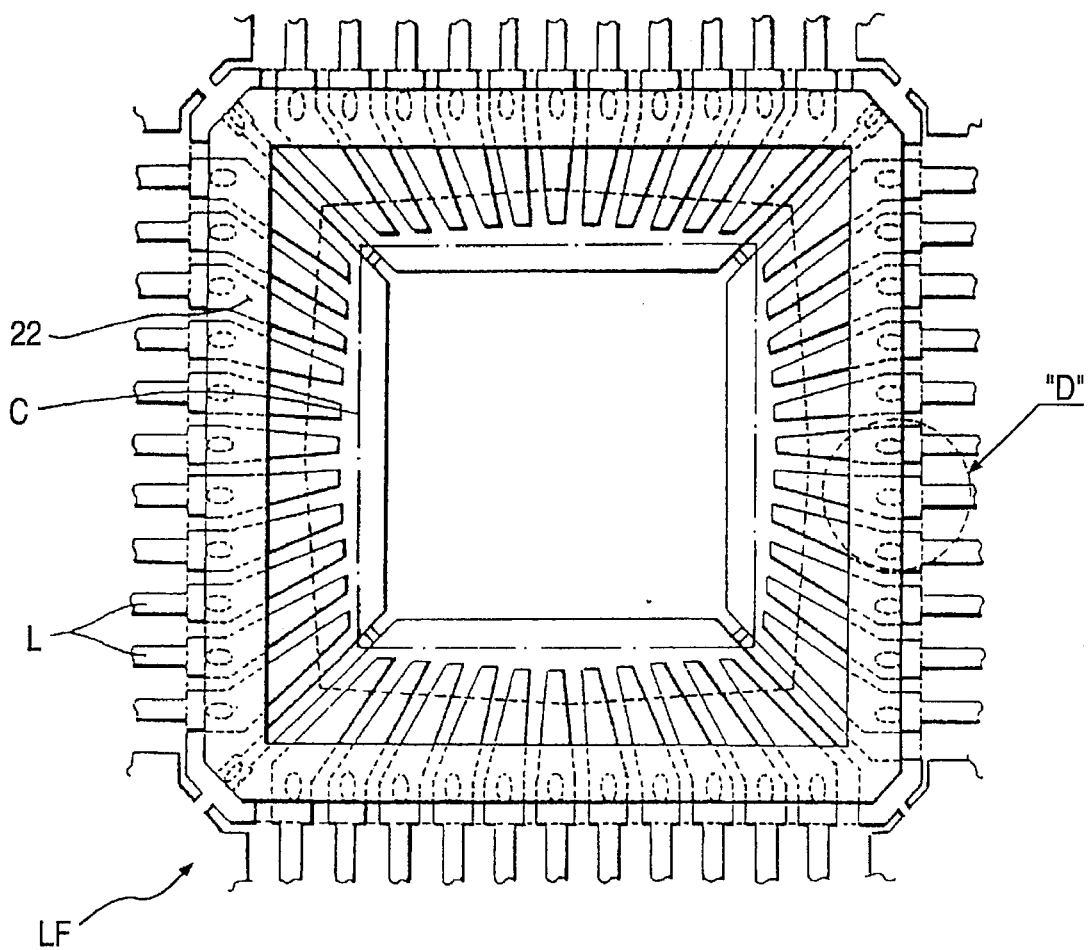
FIG. 15
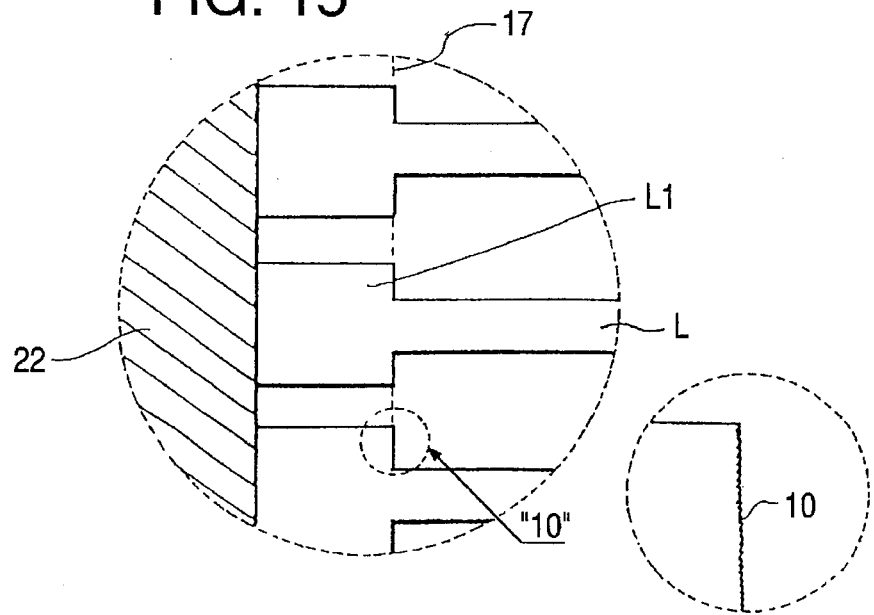
FIG. 15A

METHOD FOR MOLDING OF INTEGRATED CIRCUIT PACKAGE

This application is a continuation of application Ser. No. 08/349,237, filed Dec. 5, 1994, now abandoned.

BACKGROUND OF THE INVENTION

1. Field of the Invention

The present invention relates in general to production of integrated circuit packages and, more particularly, to method and device for molding integrated circuit packages using lead frames free from a dambar.

2. Description of the Prior Art

In recent times, cheap IC packages (integrated circuit packages) such as made of synthetic resins have been generally used rather than expensive IC packages such as made of ceramic, thus to cut down expenses in using the IC packages. The quality improvement of the resin IC packages makes it possible to produce high value added IC packages using cheap resins. In the past, such high value added IC packages would be produced only using expensive ceramic.

The cost of IC packages is increased due to expense for trimming equipment as well as to waste of labor and time for trimming the package assembly, which package assembly is a unit product in the package state. The trimming operation for the package assembly also may cause the products to be delivered after delay of the time limit for delivery and this gives a bad effect on production and sale of the IC packages.

In the near future, the lead interval of an IC package will be reduced from at least 0.35 mm to about 0.15 mm, so that the expenses for punches, which punches are used for cutting off lead connecting dambars from the lead frame, as well as for the trimming equipments will be very heavy.

Moreover, the dambar cutting operation for the package should give a bad effect on the leads and this may cause deformation and damage of the leads due to shock generated in the trimming step and in the forming step. Thus, high quality products may be not provided.

In this regard, an IC package is needed which is produced by forming a molded housing around a lead frame free from a dambar (hereinbelow, referred to simply as "the dambarless lead frame").

The procedure for production of a typical IC package is started with inspection of raw material for the package as represented in the flow diagram of FIG. 1. The raw material inspection step is followed by a die preparation step, otherwise stated, a chip preparation step. Thereafter, the package production procedure is carried out in order of a die (chip) bonding step, a wire bonding step, a molding step (a packaging step), a trimming step, a plating step, a marking step and a forming step.

Both the molding step and the trimming step of the above procedure will be described in detail hereinbelow.

Molding (packaging) step: the semiconductor chip interconnecting to the lead frame by means of wires is molded in predetermined shape of mold dies using thermosetting resins, thus to form a molded housing. The molded housing, which is formed around the lead frame, is to protect the internal circuit devices and the semiconductor chip from external impact as well as to form the configuration of the package. In the molding step, the thermosetting resins are hardened for a given time and at a given temperature, thus to provide desired rigidity for the molded housing.

Trimming step: the dambars, which connect the leads to each other so as to prevent possible resin leakage during the molding step, are cut off in the trimming step from the lead frame of the package after the molding step so that the configuration of each resulting package agrees with use of the package.

In order to mold the package 15, a lead frame shown in FIGS. 4 and 5 is laid on a bottom mold die BM shown in FIG. 6. Thereafter, a top mold die TM is set on the bottom mold die BM so that the top mold die TM presses the dambars DB of the lead frame LF (FIG. 5). In this state, the thermosetting resins are injected into a cavity defined between the top and bottom mold dies TM and BM so as to form the molded housing around the lead frame LF. In this molding step, the dambars DB connecting the leads L of the lead frame LF to each other prevent the resins from leaking out of the two mold dies through the gaps between the leads L.

As shown in FIGS. 8, 9 and 10, each of the top and bottom mold dies TM and BM has dambar pressing projections P, each projection P having a flat pressing surface. When molding a package using a dambarless lead frame LF, the resins may leak either from the gaps between the leads L or from the gaps between the top and bottom surfaces of the lead frame LF and the top and bottom mold dies TM and BM even though the leads L of the dambarless lead frame LF are tightly pressed by the mold dies TM and BM. This gives a bad effect on the package molding conditions and deteriorates quality of products. In this regard, it is nearly impossible to mold and produce IC packages using the dambarless lead frames in the prior art. The package molding part 11 and the part 12 is outside the package.

SUMMARY OF THE INVENTION

It is, therefore, an object of the present invention to provide method and device for molding an IC package in which a molded housing is formed around a dambarless lead frame with no problem caused in the molding step.

In order to accomplish the above object, the lead frame and either of top and bottom mold dies used in the molding step are provided with means for preventing resin leakage out of the two mold dies respectively, thus to minimize the resin leaking pressure as well as the amount of resin leaking out of the two mold dies. The gaps defined between the leads of the dambarless lead frame are closed by the two mold dies, thus to prevent the molding resins from leaking out of the two mold dies.

In accordance with an embodiment of the invention, a tape as the resin leakage preventing means is put on a package molding part of the dambarless lead frame and, thereafter, a semiconductor chip is mounted on the lead frame having the tape. The lead frame having the chip in turn is subjected to a molding step for forming a molded housing around the lead frame. In this embodiment, the top and bottom mold dies used for molding the package are provided with projections for preventing the resin leakage out of the two mold dies.

In accordance with another embodiment of the invention, the outer leads of the lead frame are provided with enlarged area sections respectively and either of the top and bottom mold dies is provided with projections which will be placed in the spaces defined between the inner leads and the enlarged area sections of the outer leads of the lead frame during the molding step, thus to readily form the molded housing around the dambarless lead frame without causing any problem during the molding step.

In accordance with a still another embodiment of the invention, an auxiliary lead frame having a plurality of rectangular openings arranged in series and spaced at regular intervals is fixedly placed on the bottom mold die. The dambarless lead frame is laid on the auxiliary lead frame and, thereafter, clamped by the top mold die and, in this state, the molding step is carried out for forming the molded housing around the dambarless lead frame.

BRIEF DESCRIPTION OF THE DRAWINGS

The above and other objects, features and other advantages of the present invention will be more clearly understood from the following detailed description taken in conjunction with the accompanying drawings, in which:

FIG. 14 is a plan view of a unit of a dambarless lead frame in accordance with a primary embodiment of the present invention;

FIG. 15 is an enlarged view of taped leads or of the encircled section D of the unit lead frame of FIG. 14;

FIG. 15A is an enlarged view of the notches in FIG. 15.

DESCRIPTION OF THE PREFERRED EMBODIMENTS

In accordance with the present invention, a lead frame free from dambar, otherwise stated, a dambarless lead frame LF, which dambar is used for connecting leads L to each other in a typical lead frame with dambars as well known to those skilled in the art, is subjected to a molding step so as to form a molded housing around the lead frame and to produce the IC package.

In a method for production of the IC package of the invention, the dambarless lead frame LF, after being subjected to a typical die bonding step for mounting a semiconductor chip C on the lead frame LF as well as to a typical wire bonding step for bonding the wires to the chip C and to the lead frame LF, is placed between top and bottom mold dies which define between them a cavity for forming the molded housing around the lead frame. In the molding step, thermosetting resins are injected into the cavity defined between the two mold dies, thus to form the molded housing around the dambarless lead frame LF and to produce the IC package.

The top and bottom mold dies TM and BM of the invention, which mold dies are used for producing the IC package using the dambarless lead frame LF, are constructed so that they reliably isolate the package molding part of the dambarless lead frame LF from the package outside part of the lead frame LF. That is, the two mold dies TM and BM of the invention is constructed so that they close the molding cavity defined between them.

In order to achieve the above object, either of the two mold dies of the invention is provided with first means MH for preventing possible resin leakage out of the mold dies during the molding step. With the resin leakage preventing means MH, the mold dies reliably prevent the resins from leaking out of the mold dies and finish the molding step without causing any problem.

Figure 1:
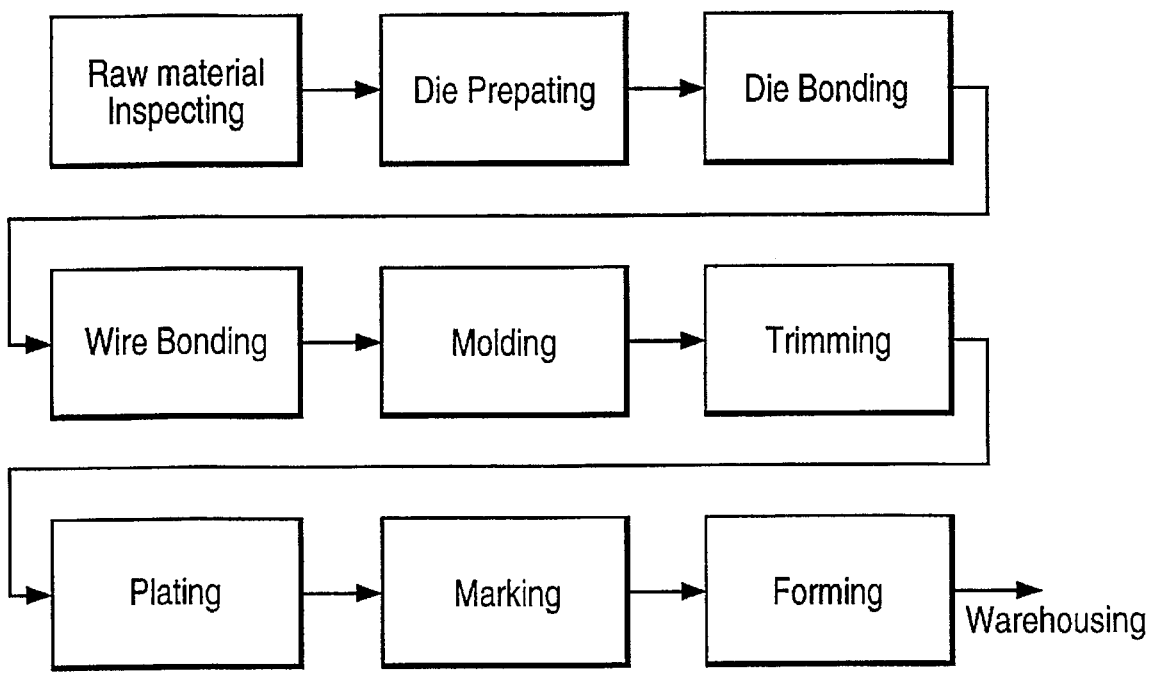
FIG. 1 is a flow diagram showing a procedure for producing a typical IC package using a lead frame having lead connecting dambars.
Figure 2:
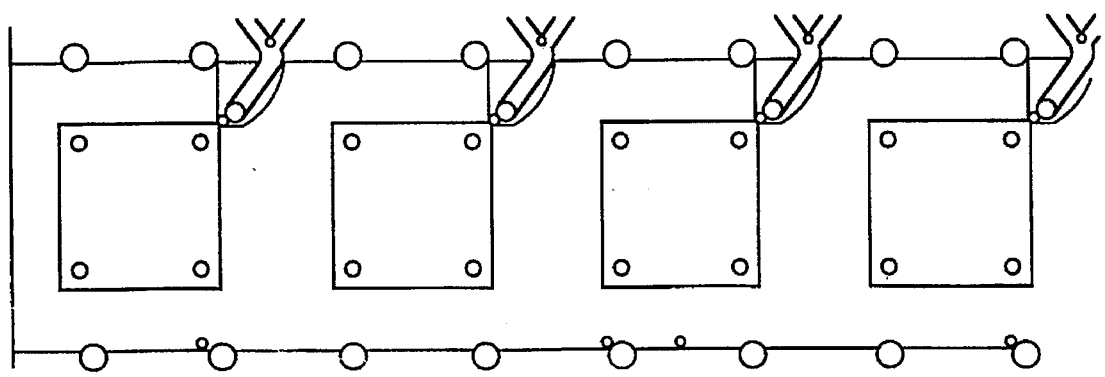
FIG. 2 is a top view showing a structure of a typical strip mold die.
Figure 3:
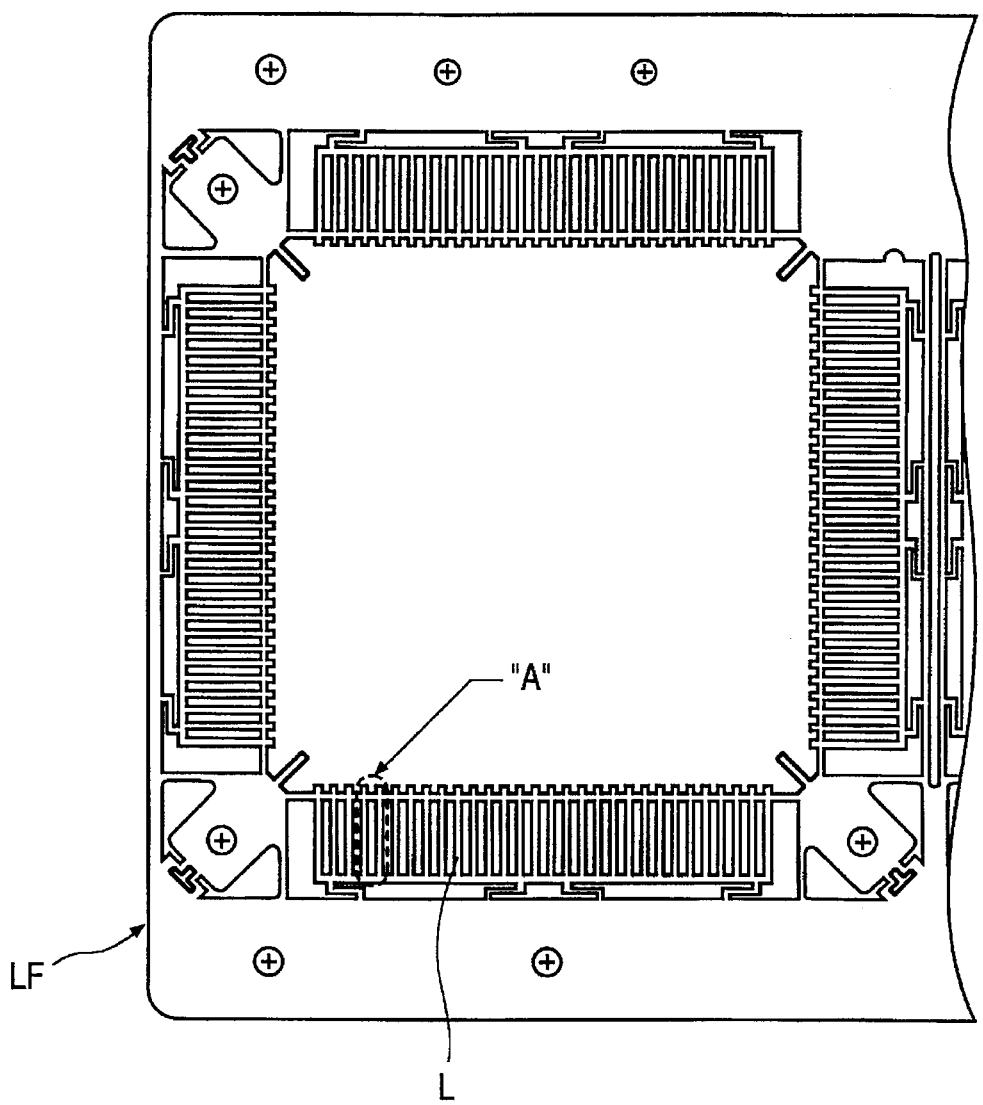
FIG. 3 is a partial enlarged top view showing a structure of a typical strip lead frame.
Figure 4:
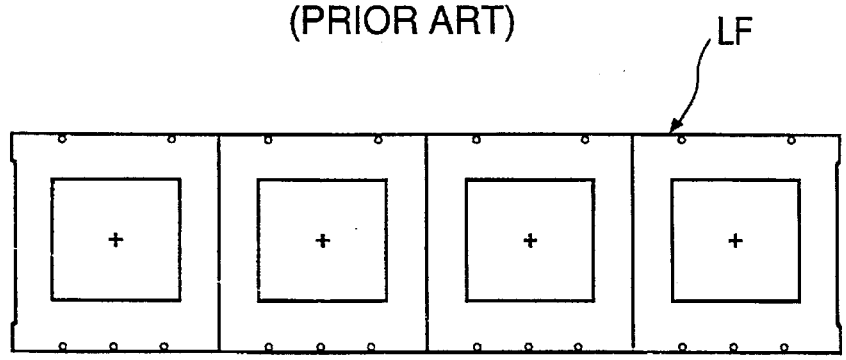
FIG. 4 is a top partially enlarged view showing a typical strip lead frame.
Figure 5:
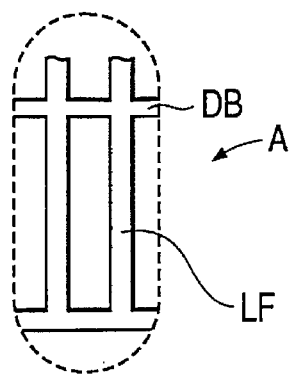
FIG. 5 is an enlarged view of the section A of FIG. 3.
Figure 6:
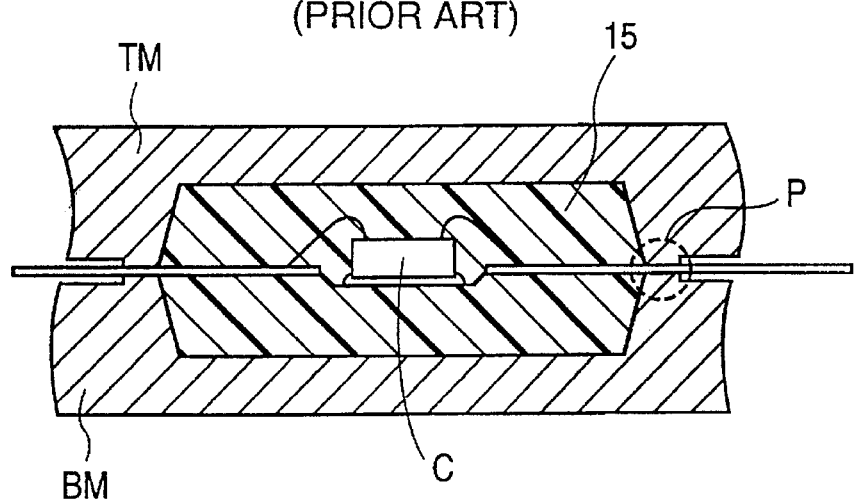
FIG. 6 is a sectional view of typical top and bottom mold dies which define between them a cavity for forming the molded housing around the lead frame.
Figure 7:
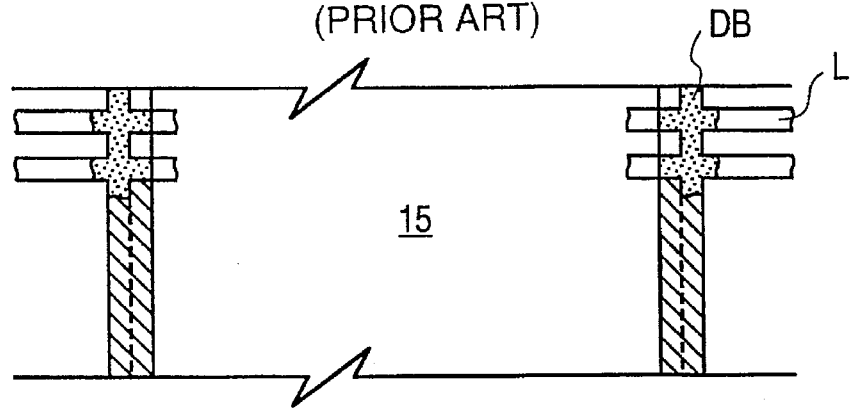
FIG. 7 is a partial plan view showing a part of the lead frame disposed between the two mold dies of FIG. 6.
Figure 8:
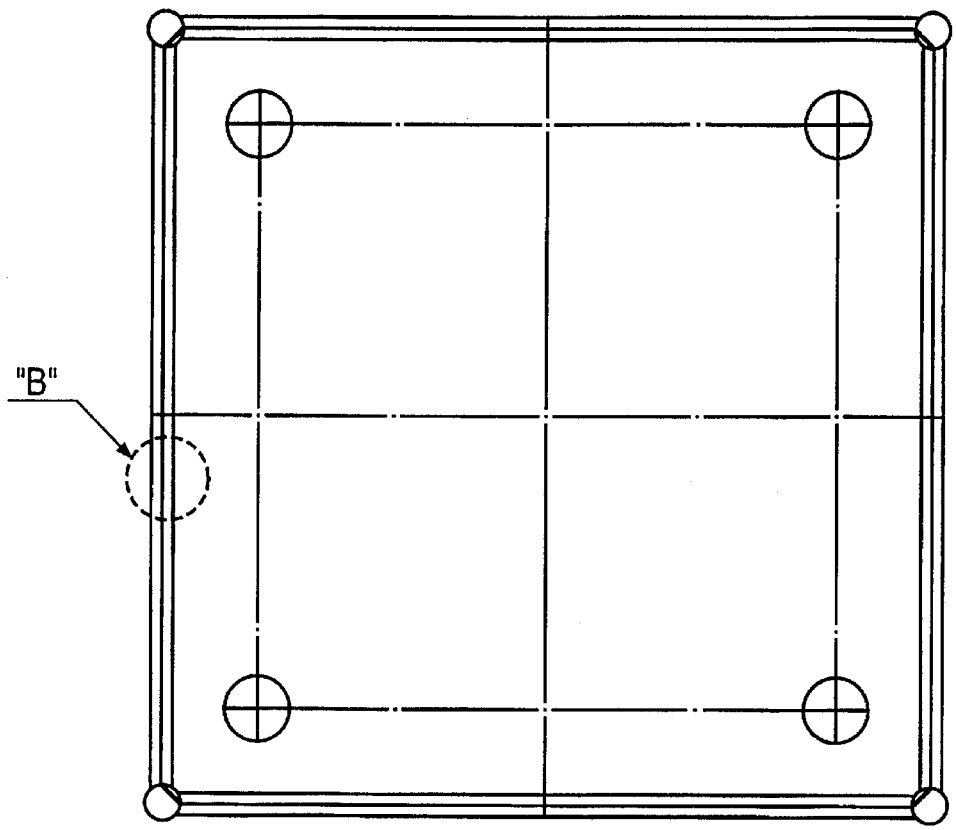
FIG. 8 is a plan view of a unit of the typical mold dies.
Figure 9:
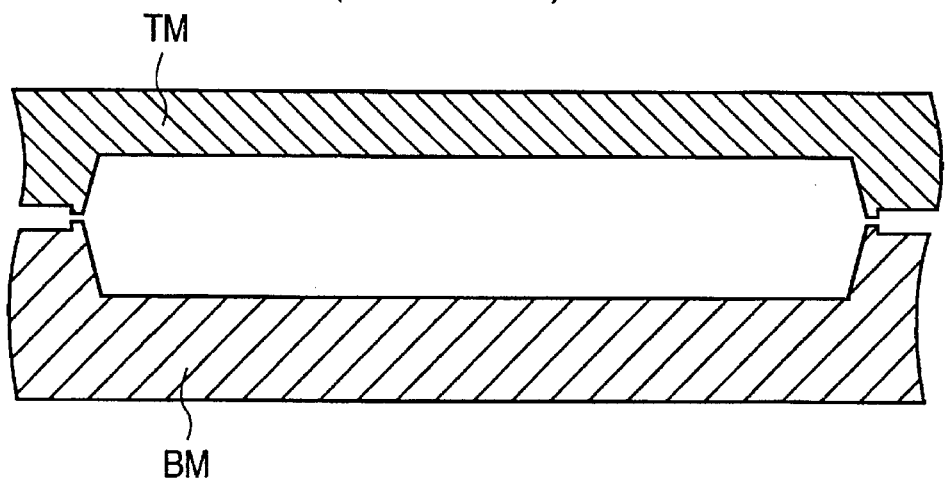
FIG. 9 is a sectional view of the unit of FIG. 8.
Figure 10:
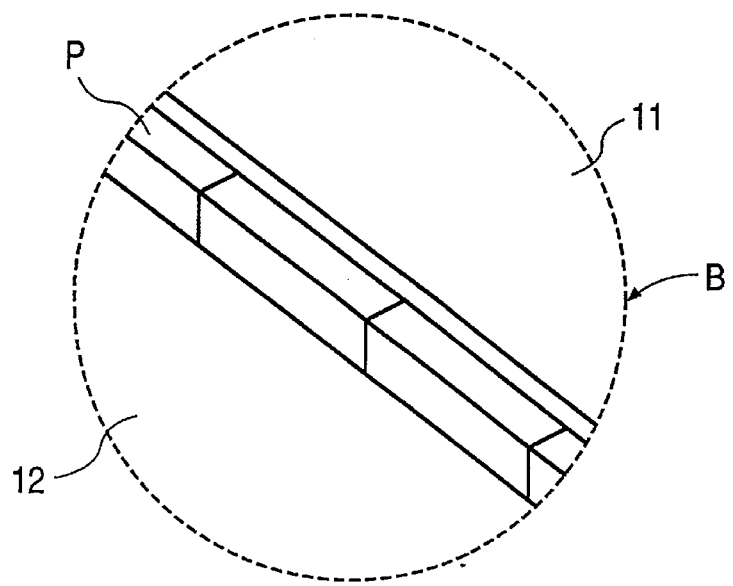
FIG. 10 is an enlarged perspective view of a lead pressing portion or of the encircled section B of the unit of FIG. 8.
Figure 11:
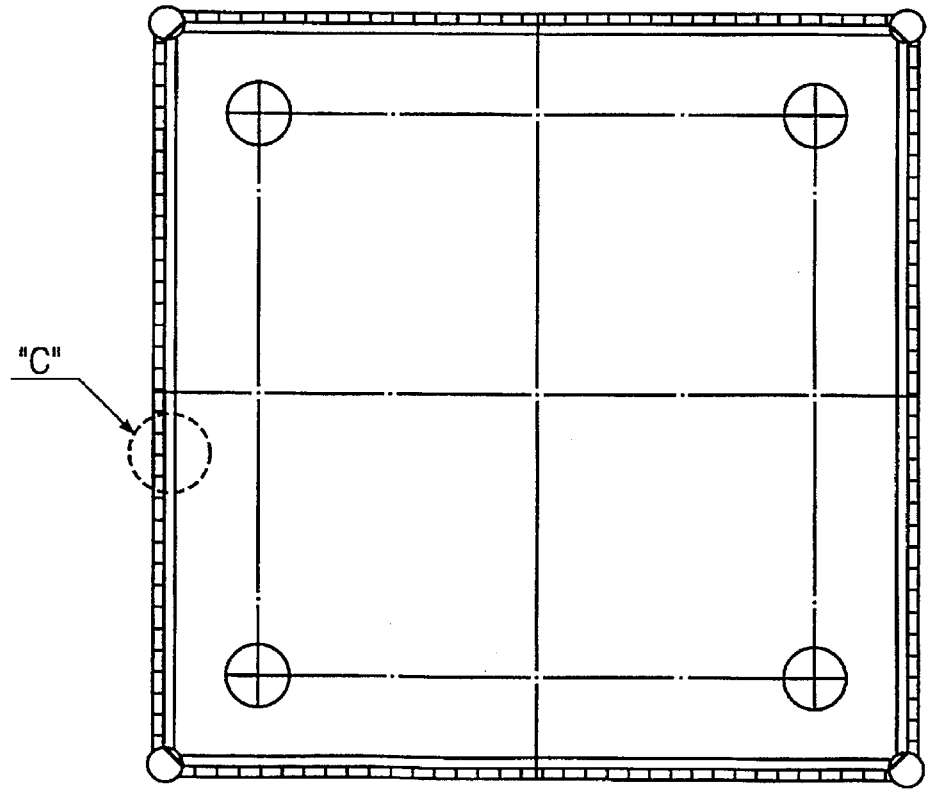
FIG. 11 is a plan view of a unit of mold dies in accordance with the present invention.
Figure 12:
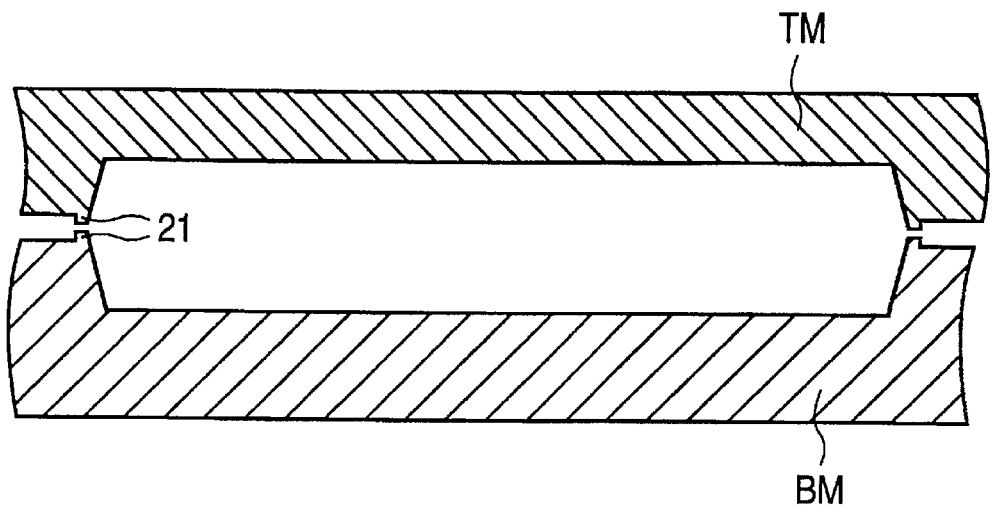
FIG. 12 is a sectional view of the mold dies of FIG. 11.
Figure 13:
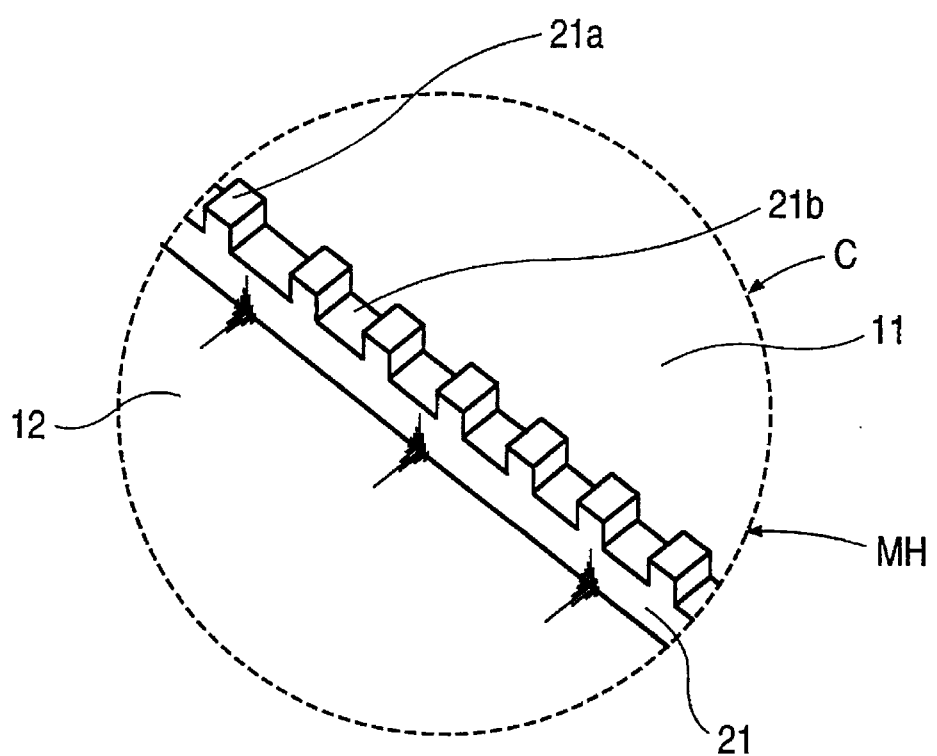
FIG. 13 is an enlarged perspective view of a lead pressing portion or of the encircled section B of the unit of FIG. 11.
Figure 16:
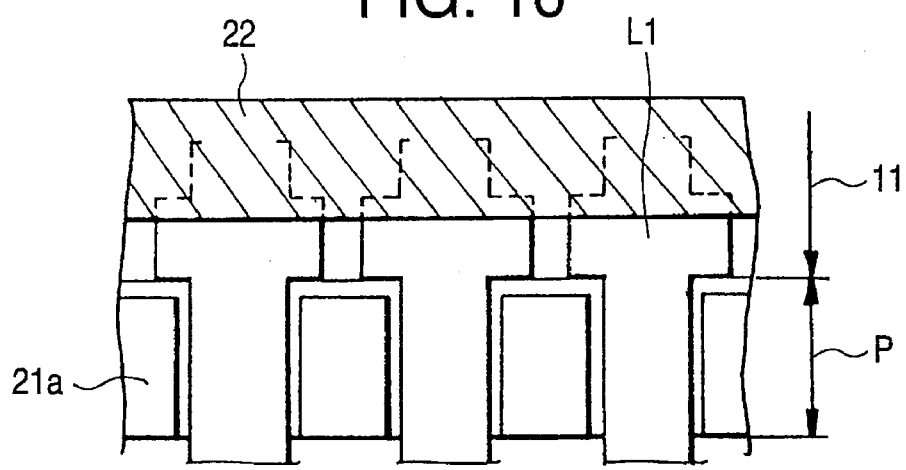
FIG. 16 is a partial plan view showing the dambarless lead frame placed in the mold dies of the invention.
Figure 17:
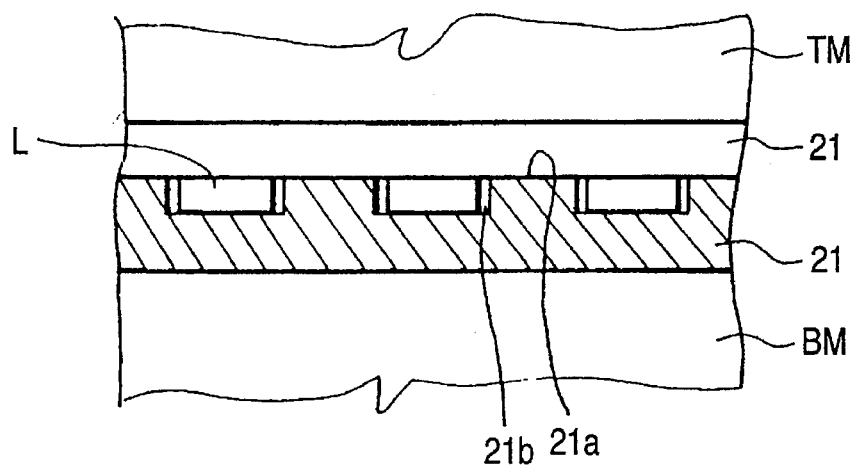
FIG. 17 is a front view of FIG. 16.
Figure 18:
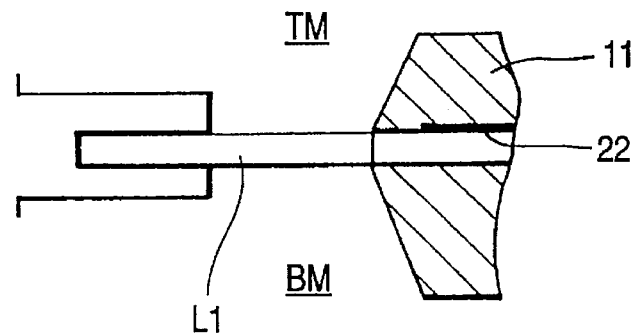
FIG. 18 is a partial side view of FIG. 16.

As shown in FIGS. 11, 12 and 13, the bottom mold die BM has a lead pressing frame 21 on its top surface. The lead pressing frame 21 includes a plurality of rectangular projections 21a which are formed on the frame 21 and spaced out at regular intervals as if they were battlements. In this embodiment, the projections 21a of the frame 21 of the bottom mold die BM act as the resin leakage preventing means MH of the invention.

Of course, it should be understood that the projections 21a may be formed on the top mold die TM instead of the bottom mold die BM.

The present invention also provide second means LH for preventing the possible resin leakage out of the mold dies by reducing the resin leaking pressure, which resin leaking pressure causes the resins to leak out of the two mold dies TM and BM.

That is, a tape 22 is put on the leads L of lead frame LF at portions just inside the mold pressed portions of the leads L, which mold pressed portions P will be pressed by the lead pressing frame 21 of the bottom mold die BM. The tape 22 is to provide binding force for the leads and to reduce the resin leaking pressure during the molding step. In addition, the resin leakage preventing means LH also includes enlarged area sections L1 provided on the leads L at the portions corresponding to the outermost package molding part of the lead frame LF as shown in FIG. 15. In this case, the edges of each enlarged area section L1 is provided with notches 10. With the enlarged sections L1 having the notches 10, the resin leaking pressure will be offset so that the desired IC package is produced using the dambarless lead frame LF. Numeral 17 denotes the outside line of the package.

The tape 22 put on the lead frame LF is for minimizing the pressure acting on the outer part of the IC package. In view of the pressure minimizing function of the tape 22, it is preferred to put the tape 22 on the outermost part of the lead frame LF as far as no problem is caused in tolerance.

In the lead pressing frame 21 of the bottom mold die BM, the projections 21a are shaped so that the height of each projection 21a is equal to the thickness of the lead L of the lead frame LF, which lead frame LF will be set between the two mold dies TM and BM. Each interval between the projections 21a or the width of each depression 21b between the projections 21a is equal to the width of each lead L.

In order to mold the IC package of the invention, the dambarless lead frame LF with the semiconductor chip C mounted thereon is laid on the bottom mold die BM having the projections 21a as the resin leakage preventing means MH. The top mold die TM is, thereafter, set on the bottom mold die BM so that the lead frame LF is tightly disposed between the two mold dies TM and BM. The thermosetting resins are injected into the cavity defined between the two mold dies so as to form the molded housing around the dambarless lead frame LF. When setting the top mold die TM onto the bottom mold die BM, the projections 21a of the bottom mold die BM are placed between the leads L of the dambarless lead frame LF respectively. In the molding step, the resin leaking pressure which will cause the resins to leak out of the two mold dies is reduced due to the resin leaking pressure reducing means LH, that is, the tape 22, the enlarged area sections L1 of the leads L and the notches 10 formed on the enlarged area sections L1. In addition, since the projections 21a of the bottom mold die BM are placed between the leads L having the enlarged area sections L1, the resins are reliably prevented from leaking out of the mold dies during the molding step, thus to form the molded housing in the desired shape around the dambarless lead frame LF.

Figure 19:
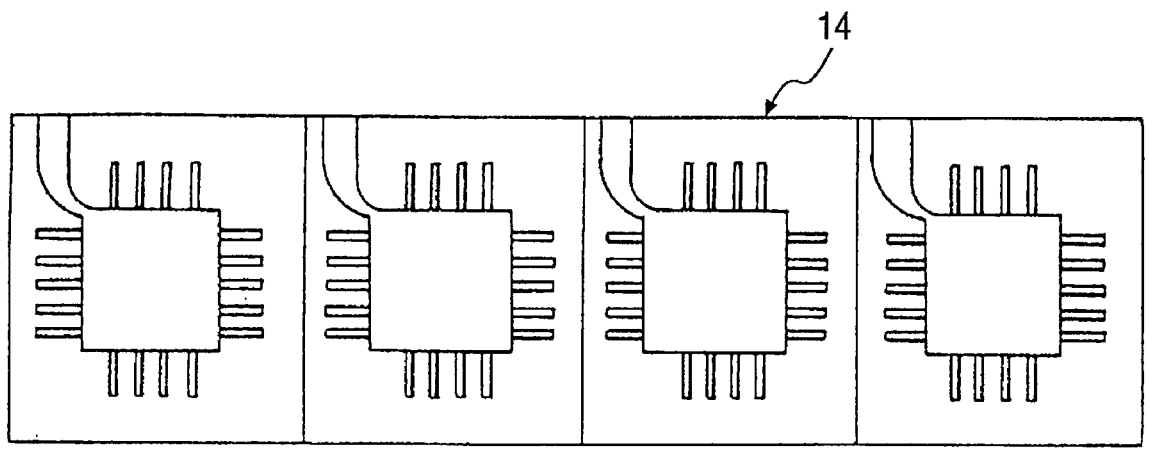
FIG. 19 is a view showing a structure of a dambarless lead frame strip in accordance with a second embodiment of the invention.
Figure 20:
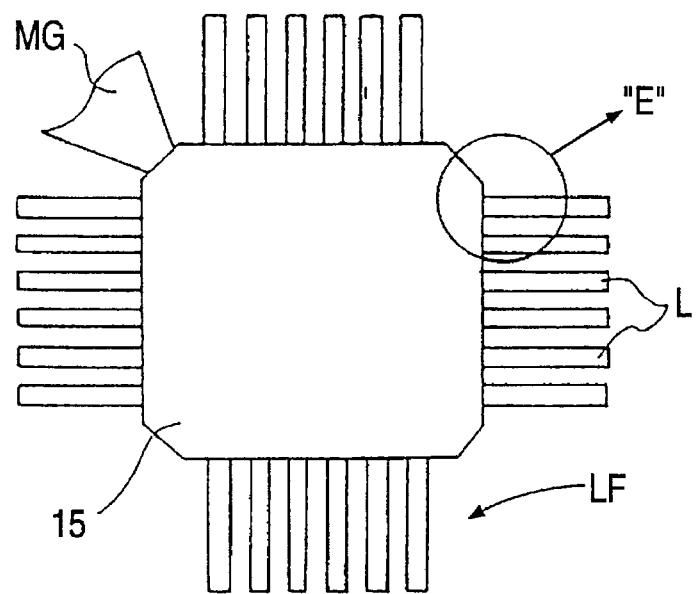
FIG. 20 is an enlarged view of a unit of the lead frame strip of FIG. 19.
Figure 21:
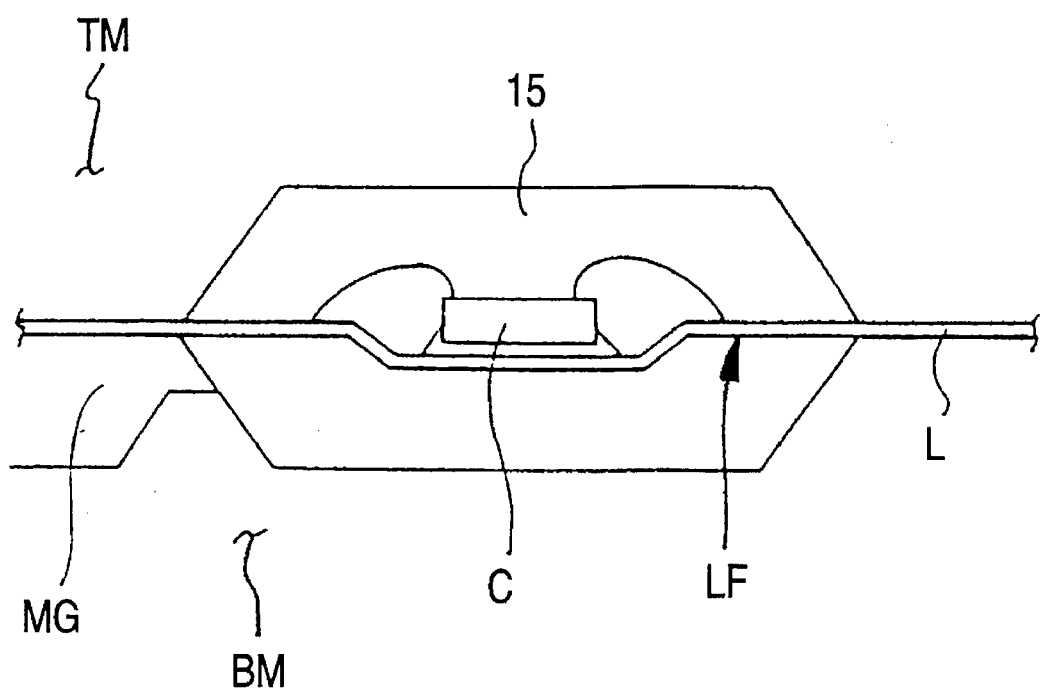
FIG. 21 is a sectional view of a semiconductor package produced using the lead frame and mold dies according to the second embodiment of the invention.

As shown in FIGS. 19 and 20 showing the lead frame in the form of a strip 14 of lead frames LF according to a second embodiment of the invention, the lead frame LF has no dambar between the leads L. FIG. 21 shows an IC package produced using the dambarless lead frame LF of the second embodiment.

In order to form the molded housing around the lead frame LF, the thermosetting resins are injected into the molding cavity, which cavity is defined between the two mold dies TM and BM, through a mold gate (MG) of FIG. 21, thus to form the molded housing in the desired shape around the lead frame LF.

Figure 22:
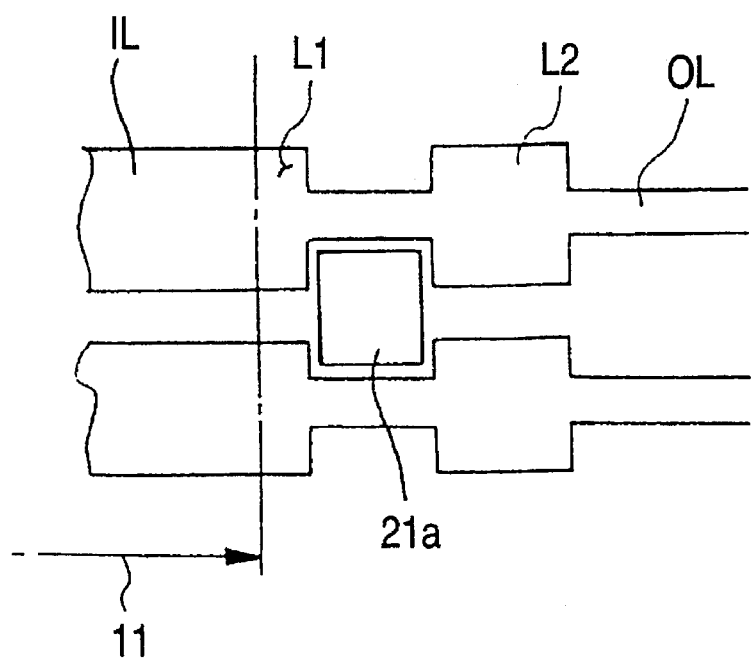
FIG. 22 is an enlarged view of the section E of the unit lead frame of FIG. 20.

Differently from the primary embodiment, the outer leads OL of the dambarless lead frame LF of the second embodiment are provided with their respective enlarged area sections L2 as shown in FIG. 22. In the lead frame LF of the second embodiment, the enlarged area sections L2 of the outer leads OL and the enlarged area sections L1 of the inner leads IL constitute the resin leakage preventing means LH of the invention. In the same manner as described for the primary embodiment, either of the two mold dies TM and BM is provided with the projections 21a as the resin leakage preventing means MH. In the molding step, the projections 21a of a mold die are placed in the rectangular spaces defined between the enlarged area sections L1 and L2 of the dambarless lead frame LF as shown in FIG. 22. The thermosetting resins are injected into the cavity defined between the two mold dies, so that the molded housing is formed on the package molding part of the lead frame LF.

Figure 23:
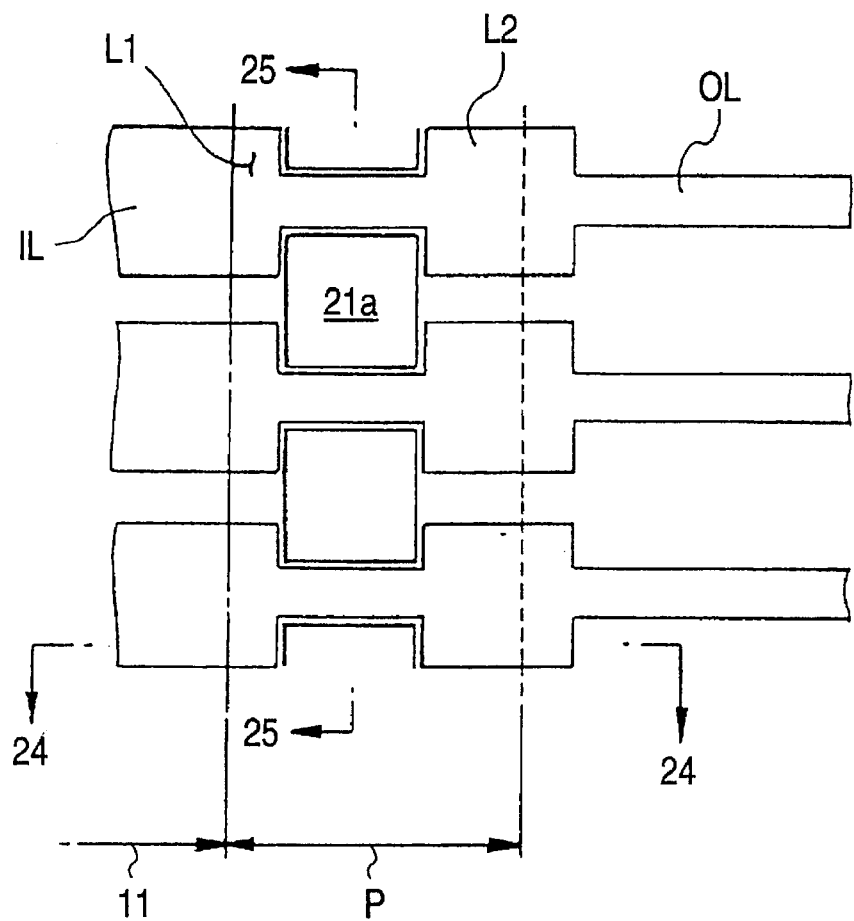
FIG. 23 is a plan view showing the leads of the lead frame of the second embodiment of the invention laid on the mold die.

As shown in FIG. 23, the dambarless lead frame LF of the second embodiment is set between the two mold dies TM and BM so that the projections 21a of either of the two mold dies are placed in the spaces defined between the enlarged area sections L1 and L2 of the leads IL and OL. At this time, flat pressing sections 21c provided on opposed sides of the projections 21a press the pressed portions P of top and bottom surfaces of the leads L.

Figure 24:
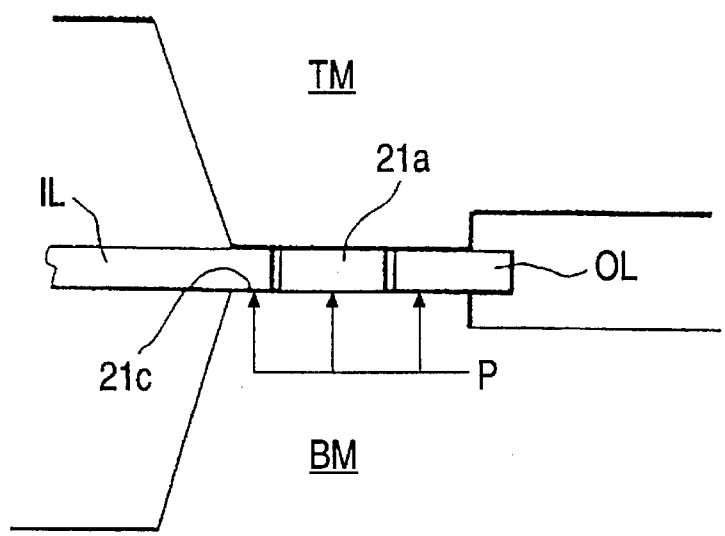
FIG. 24 is a sectional view taken along the section line 24—24 of FIG. 23.
Figure 25:
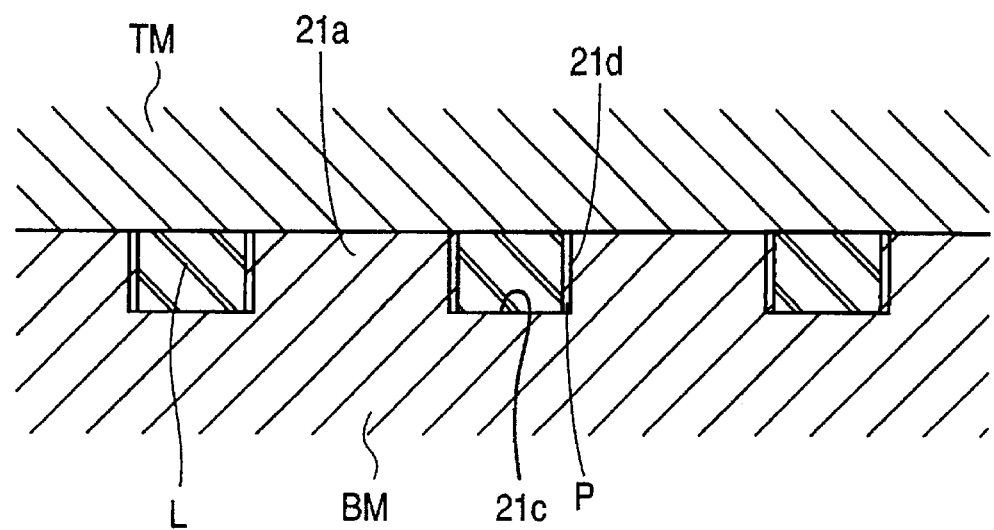
FIG. 25 is a sectional view taken along the section line 25—25 of FIG. 23.

Described in detail, the pressed portions P of the leads L are predetermined portions of the inner and outer leads IL and OL, which predetermined portions of the leads will be laid on the flat pressing sections 21c provided on opposed sides of the projections 21a of the bottom mold die BM and contact with the top mold die TM as shown in FIGS. 24 and 25.

Figure 27:
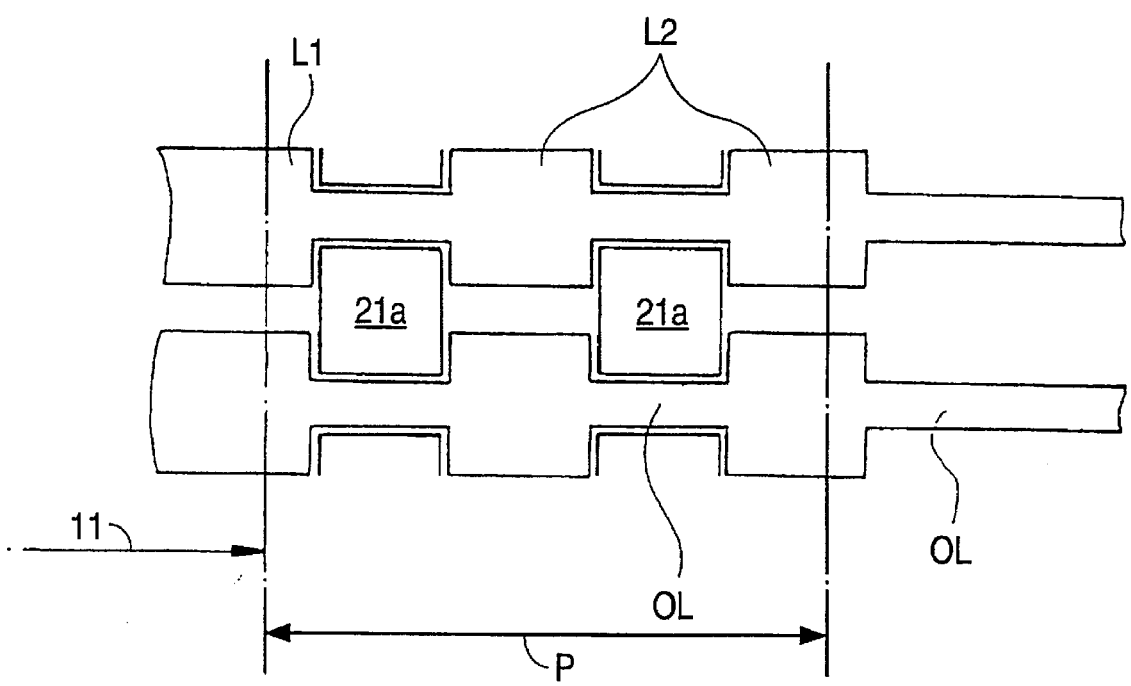
FIG. 27 is a view showing the leads of a dambarless lead frame and projections of a mold die placed in the spaces defined between the enlarged area sections of the leads according to a third embodiment of the invention.

FIG. 27 shows a lead frame according to a third embodiment of the invention. As shown in this drawing, each outer lead OL of the lead frame LF of the third embodiment has at least two enlarged area sections L2 for preventing resin leakage out of the mold dies. In order to correspond to the structure of the lead frame LF of the third embodiment, the projections 21a of the bottom mold die BM are arranged in at least two rows. In the molding step using the lead frame LF and the mold dies TM and BM of the third embodiment, the projections 21a arranged in at least two rows are respectively placed in the spaces defined between the enlarged area sections L1 and L2 of the inner and outer leads IL and OL of the lead frame LF. In the third embodiment, the resin leakage preventing effect will be more improved. The flat pressing sections 21c of the bottom mold die BM, which sections 21c will press the pressed portions P of the lead frame LF during the molding step, may be provided on opposed sides of the projections 21a or only on the outer side of the projections 21a.

In order to mold the IC package using a dambarless lead frame and top and bottom mold dies according to one of the above embodiments, the dambarless lead frame LF is laid on the bottom mold die BM prior to setting of the top mold die TM onto the bottom mold die BM. When setting the top mold die on the bottom mold die, the projections 21a of the bottom mold BM are placed in the spaces defined between the inner leads IL and the enlarged area sections L2 of the outer leads OL, while the flat pressing sections 21c of the bottom mold die BM press the pressed portions P of the lead frame LF.

Figure 26:
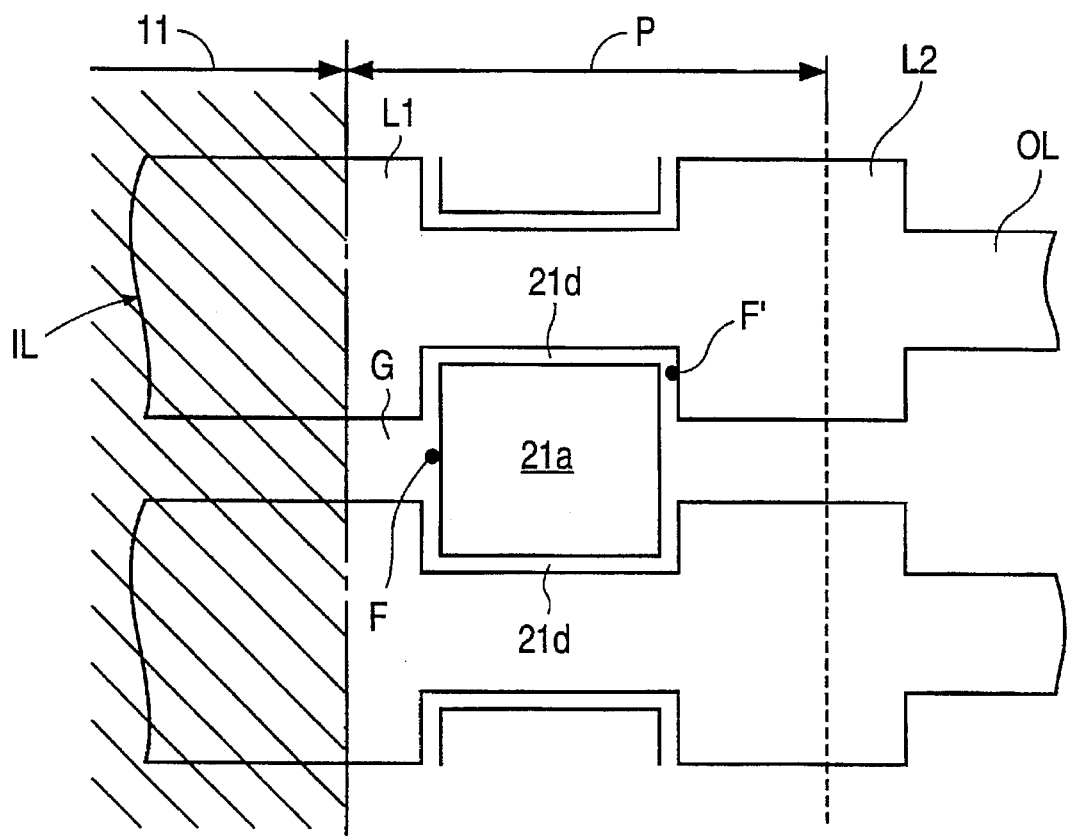
FIG. 26 is a view showing the leads of the lead frame subjected to the molding step according to the second embodiment of the invention.

In this state, the thermosetting resins are injected into the cavity between the top and bottom mold dies TM and BM through the mold gate MG under a constant pressure, thus to form the package molding part as shown in FIG. 26.

At this time, the resins intend to leak out of the mold dies due to the resin pressure. However, when the resins, after passing through the gaps G between the dambarless leads L, reach the front portion F of each projection 21a, the resins come into contact with the wall surface of each projection 21a so that the resin leaking pressure is primarily reduced and this primarily restricts the resin flowing. A part of resins free from the above primary restriction of the projections 21a is introduced into and flows in the gaps 21d, which gaps 21d are inevitably formed between the leads L and the projections 21a due to tolerance of both the leads L and the mold dies TM and BM.

However, as large particles of fillers, which fillers are contained in the resins for adding either weight or amount of the resins, are thickened when the resins flow in the gaps 21d, there is generated resistance in the resins flowing in the gaps 21d, thus to secondarily reduces the resin leaking pressure and to secondarily restrict the resin flowing. Moreover, the resins which will be hardened within a predetermined time will be preferably hardened before reaching the enlarged area sections L2 of the outer leads OL. This object is achieved by reducing the flowing velocity of the resins flowing in the narrow gaps 21d and by minimizing the amount of resins leaking out of the top and bottom mold dies TM and BM during the package molding step. In this case, the quality of the products is improved. The resins free from the above hardening will continue to flow in the gaps 21d and in turn reach the gaps F' defined between the enlarged area sections L2 of the outer leads OL and the projections 21a. When reaching the gaps F', the resins come into contact with the wall surfaces of the projections 21a so as to be thirdly restricted in their flowing and to be completely prevented from leaking.

In the third embodiment of the invention, each outer lead OL of the dambarless lead frame LF has at least two enlarged area sections L2 for preventing the resins from leaking out of the mold dies. In order to correspond to the construction of this lead frame LF, the projections 21a of the bottom mold die BM are arranged in at least two rows. When molding the package using the above lead frame LF and the mold dies TM and BM, the projections 21a arranged in at least two rows are respectively placed in the spaces defined between the enlarged area sections L1 and L2 of the inner and outer leads IL and OL of the lead frame LF. The resins are thus repeatedly restricted in their flowing by the projections 21a and the enlarged area sections L2 of the outer leads OL so that the resins are prevented from leaking out of the mold dies during the molding step.

Figure 28:
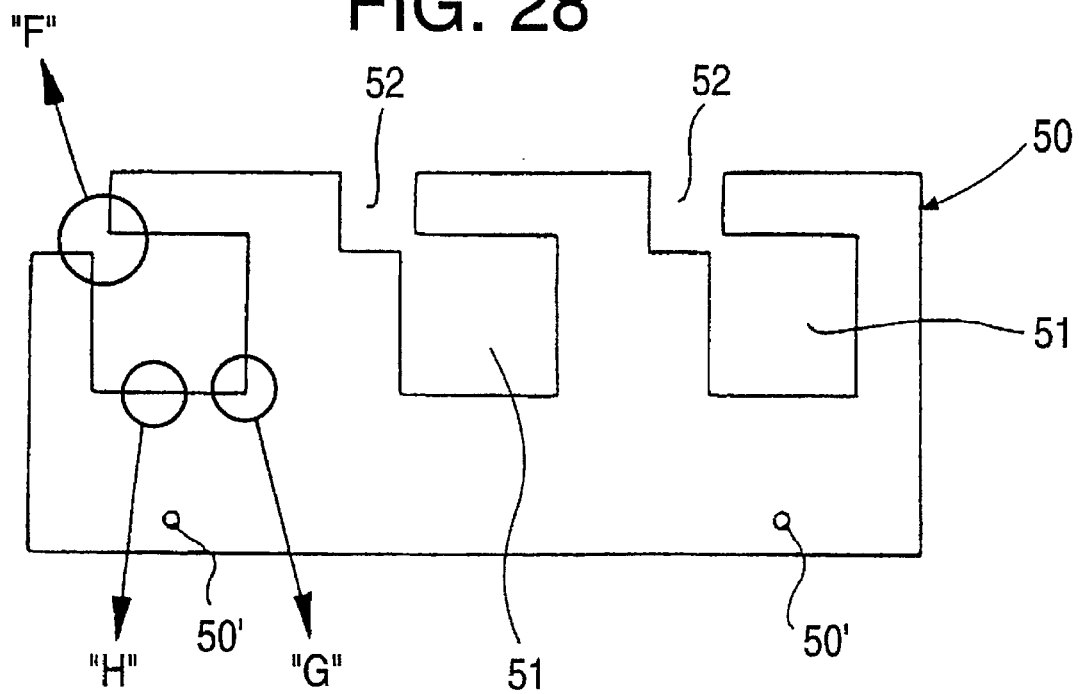
FIG. 28 is a view showing a structure of an auxiliary lead frame used in the molding step according to a fourth embodiment of the invention.

In accordance with a fourth embodiment of the invention, an auxiliary lead frame 50 is used as the resin leakage preventing means as shown in FIG. 28. With the auxiliary lead frame 50, the resins are prevented from leaking out of the mold dies TM and BM during the package molding step.

The auxiliary lead frame 50 is made of a metal thin plate having the same thickness as the dambarless lead frame LF. The auxiliary lead frame 50 has a plurality of rectangular openings 51 which are arranged in series and adapted for preventing possible clamping interference between the top and bottom mold dies TM and BM during the package molding step. The auxiliary lead frame 50 is also notched about the rectangular openings 51 so that the openings 51 open to the outside of the lead frame 50 through the notches 52. In the package molding step, the mold gate runners are located in the notches 52 and inject the resins into the cavity CA defined between the top and bottom mold dies TM and BM.

Figure 29:
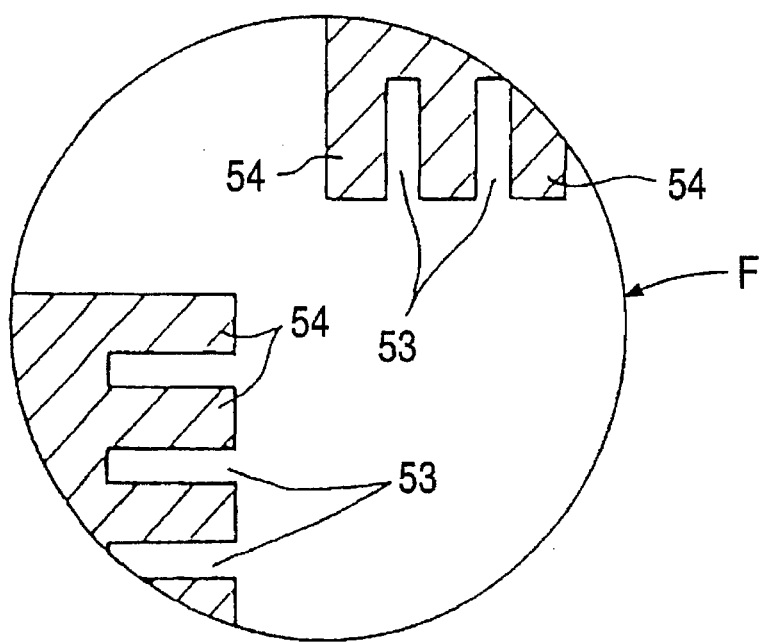
FIG. 29 is an enlarged view showing a structure of the encircled part "F" of FIG. 28.

In order to prevent possible clamping interference between the top and bottom mold dies TM and BM during the package molding step, a plurality of lead slits 53 are formed about the rectangular openings 51 as shown in FIG. 29. The width of each lead slit 53 is equal to lead width (W)+tolerance ($\alpha$). The lead slits 53 receive the leads L of the lead frame LF therein respectively.

A plurality of resin leakage preventing members 54 are formed between the lead slits 53. These members 54, which are located between the leads L of the lead frame LF during the molding step, act as dams for preventing the resins from leaking out of the mold dies TM and BM.

Figure 30:
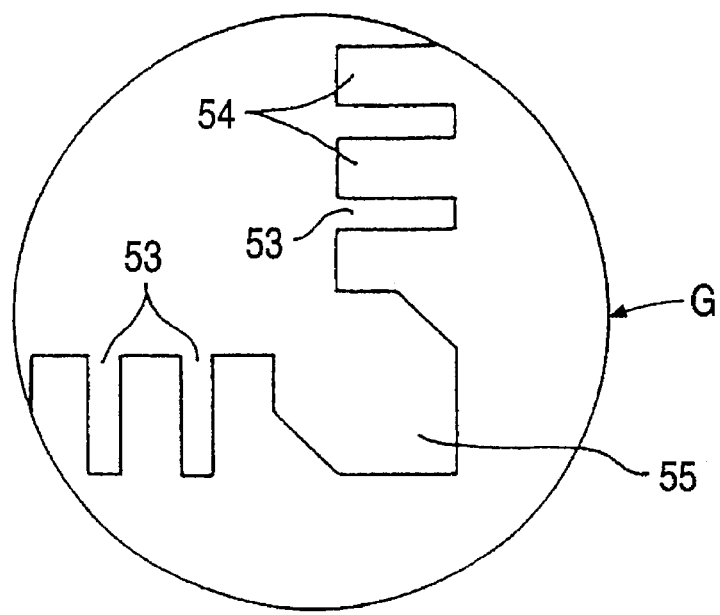
FIG. 30 is an enlarged view showing a structure of the encircled part "G" of FIG. 28.
Figure 31:
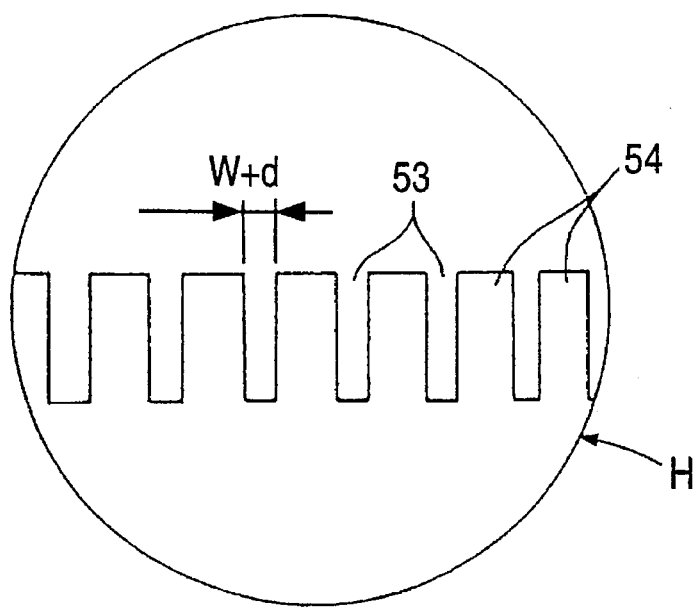
FIG. 31 is an enlarged view showing a structure of the encircled part "H" of FIG. 28.

An air vent 55 that is formed in a side corner of each rectangular opening 51 as shown in FIG. 30 causes the interior air of the cavity defined between the top and bottom mold dies TM and BM to be vented to the exterior of the cavity during the package molding step.

Figure 32:
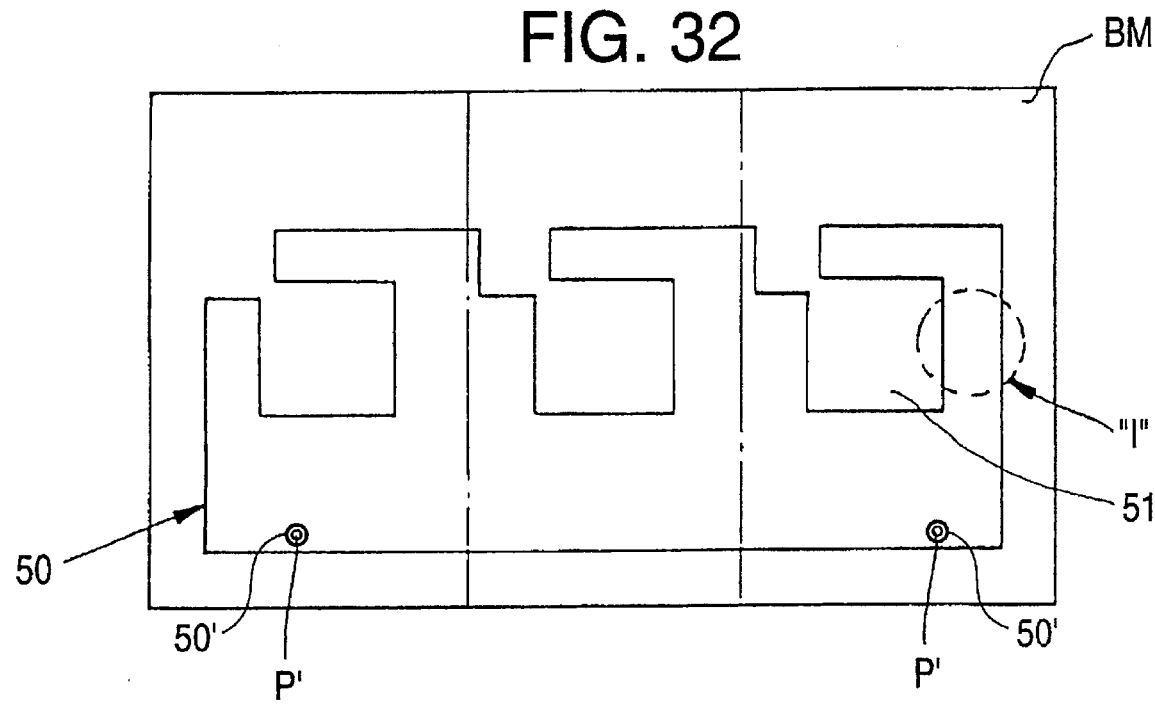
FIG. 32 is a plan view of the auxiliary lead frame of FIG. 28 laid on the bottom mold die.

In order to mold the IC package using the above auxiliary lead frame 50, the auxiliary lead frame 50 is laid on and fixed to the bottom mold die BM as shown in FIG. 32.

In order to fix the auxiliary lead frame 50 to the bottom mold die BM, the lead frame 50 is holed so as to form holes 50' in the lead frame 50, while the bottom mold die BM is provided with fixing pins P'. The fixing pins P' are inserted into and coupled to the holes 50', thus to fix the auxiliary lead frame 50 to the bottom mold die BM.

Figure 33:
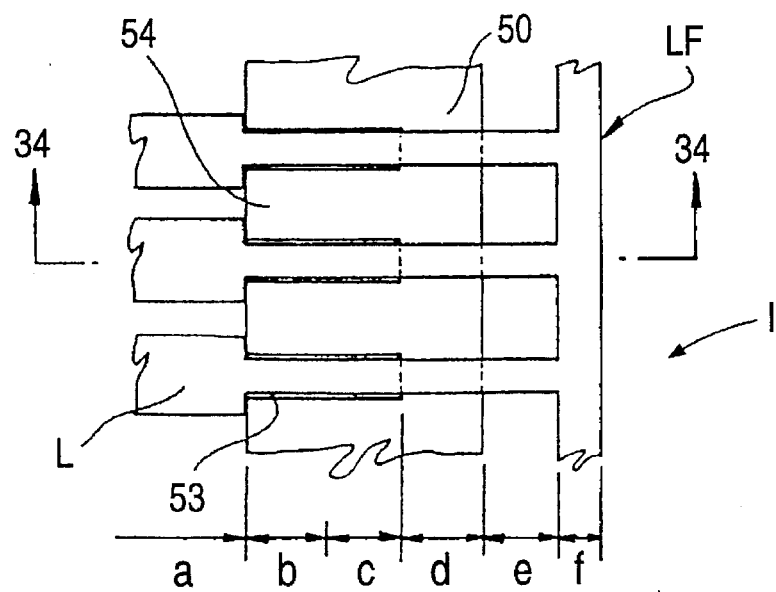
FIG. 33 is an enlarged view showing a structure of the encircled part "I" of FIG. 32.

Thereafter, the dambarless lead frame LF is laid on the auxiliary lead frame 50 as shown in FIG. 33.

Figure 34:
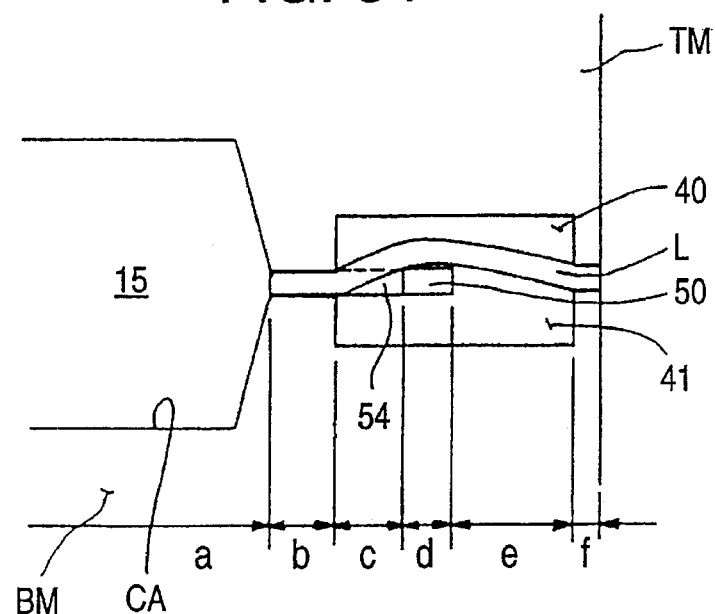
FIG. 34 is a sectional view taken along the section line 34—34 of FIG. 33.
Figure 35:
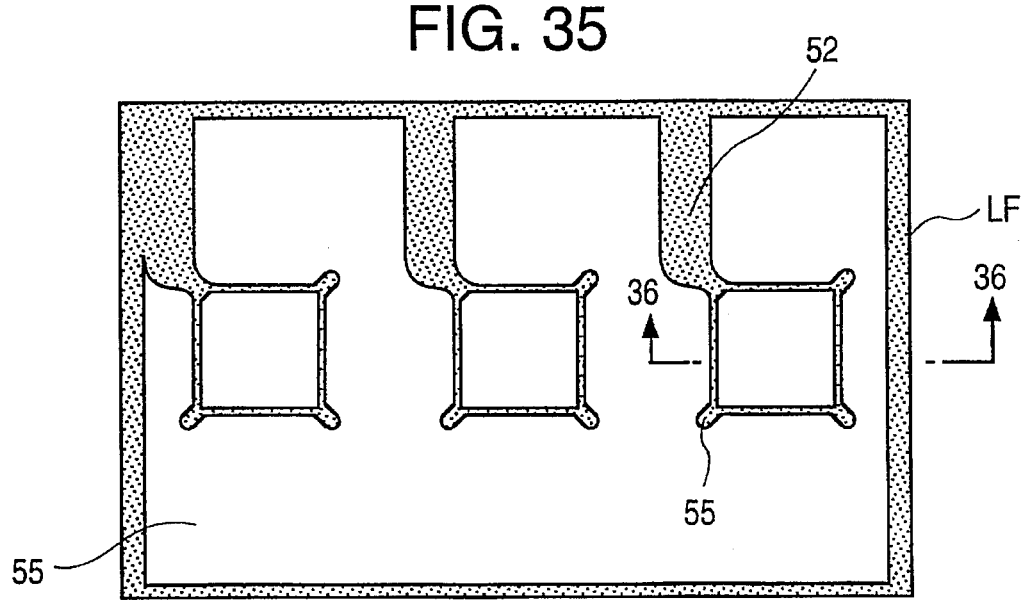
FIG. 35 is a plan view of mold dies used with the auxiliary lead frame of the fourth embodiment of the invention.
Figure 36:
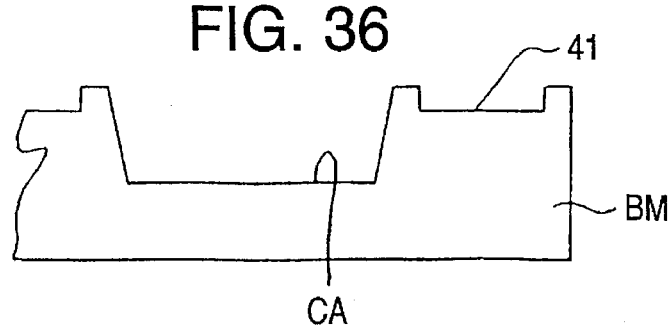
FIG. 36 is an enlarged sectional view taken along the section line 36—36 of FIG. 35.

When the dambarless lead frame LF laid on the auxiliary lead frame 50 is subjected to the molding step, the molded housing is formed around the "a" part of the cavity as shown in FIG. 34. However, the leads L of the dambarless lead frame LF as well as the resin leakage preventing members 54 of the auxiliary lead frame 50 are compressed at the "b" part by the top and bottom mold dies TM and BM, thus to prevent the resins inside the cavity from leaking out of the mold dies.

As shown in FIG. 34, there is an overlapped part or the "d" part wherein each lead L of the dambarless lead frame LF is overlapped with the auxiliary lead frame 50. However, the top and bottom mold dies TM and BM of the invention have their respective depressions 40 and 41, so that the part of each lead L of the dambarless lead frame LF overlapped with the metal part of the auxiliary lead frame 50 is compressed by neither the top mold die TM nor the bottom mold die BM. Therefore, the dambarless lead frame LF is not damaged.

In the present invention, the tape as resin leakage preventing means is put on the package molding part of leads prior to mounting the semiconductor chip on a dambarless lead frame, which dambarless lead frame has no dambar for connecting the leads of the lead frame to each other. The top and bottom mold dies of the invention used for molding the dambarless lead frame are provided with projections as another resin leakage preventing means. In an embodiment, at least one enlarged area section is formed on each outer lead of the dambarless lead frame. When molding a desired IC package using the above mold dies and the above dambarless lead frame, the projections of a mold die are placed in spaces defined between the inner leads and the enlarged area sections of the outer leads of the lead frame. In another embodiment, an auxiliary lead frame which has a plurality of rectangular openings arranged in series and spaced at regular intervals is laid on the bottom mold die. In this another embodiment, the dambarless lead frame is laid on the auxiliary lead frame on the bottom mold die and, thereafter, clamped by the top mold die prior to the molding step. The present invention readily molds the IC package using the dambarless lead frame and lets the IC package production procedure desirably omit the conventional trimming step. As the conventional trimming step is omitted from the IC package production procedure of this invention, the leads of the lead frame will not be damaged and this improves quality of products or of the precise IC packages.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of molding an integrated circuit package including an integrated circuit chip comprising the steps of:
   a) providing a dambarless lead frame having inner leads and outer leads with an enlarged area section on each inner lead at a position where the inner leads extend outside a package molded part of the lead frame;
   b) bonding an IC chip to said lead frame;
   c) bonding bond wires to inner leads of said lead frame from the chip;
   d) providing a bottom mold die and a top mold die, said dies having peripheral surfaces forming an interior die cavity, at least one of said peripheral surfaces including a plurality of spaced projections;
   e) placing a tape on at least one of the top and bottom surfaces of said enlarged area sections at a position aligned with said peripheral surfaces for reducing resin leaking during molding and for binding the inner leads together;
   f) placing the dambarless lead frame between the dies, said lead frame having a thickness substantially equal to the height of the plurality of projections on said peripheral surfaces, each outer lead having a width substantially equal to a spacing between adjacent ones of said plurality of projections and a thickness substantially equal to a height of said plurality of projections;
   g) clamping the lead frame between said dies, with the plurality of projections fitting between every two adjacent ones of said outer leads to prevent leakage of molding resin from the die cavity; and
   h) injecting a molding resin into the die cavity such that the molding resin is substantially prevented from leaking out from the mold dies.

2. The method of claim 1 further comprising the step of: during step e) aligning the taped leads so that the tape also extends inside of molded pressed portions of the lead frame, such that said tape reduces resin leaking pressure in step h).

3. The method of claim 1 further comprising the steps of: providing a widened width to a portion of each of outer leads of the lead frame adjacent to the die peripheral surfaces; and prior to step g) placing the plurality of projections respectively in spaces defined between inner leads of the lead frame and the widened widths of two adjacent outer leads of the lead frame.

4. The method of claim 3 further comprising the step of: notching a surface of said widened widths of said outer leads to reduce the molding leaking pressure.

5. The method of claim 3 further comprising the steps of: providing at least two rows of widened widths of the outer leads and at least two rows of projections: and
   interfitting each row of the projections between spaces between each row of the widened widths of the outer leads, respectively.

6. The method of claim 1, further including placing said tape on the enlarged area sections of the inner leads so that each enlarged area section is partially exposed outside the tape on an outer lead side of the enlarged area sections.

7. A method for molding an integrated circuit package comprising the steps of:
   providing a top mold die and a bottom mold die, a peripheral edge of one of said mold dies facing a peripheral edge of the other mold die and forming a mold cavity, said edges including a plurality of depressions;
   providing a dambarless first lead frame having spaced inner leads and spaced outer leads with an enlarged area section on each inner lead at a position where each enlarged area section extends outside a package molding part of the lead frame, and an integrated chip bonded to the first lead frame and wire-bonded to selected ones of the spaced inner leads;
   placing a tape on at least one of top and bottom surfaces of said enlarged area portions at a position inside a first portion of the first lead frame to be pressed by the mold dies for binding the inner leads together;
   providing an auxiliary lead frame, said auxiliary lead frame having a thickness the same as the thickness of said first lead frame, having a plurality of openings for allowing said first lead frame to be in the same plane as said auxiliary lead frame, wherein each opening includes a plurality of resin leakage preventing members corresponding to said outer leads;
   placing the auxiliary lead frame on the bottom mold die;
   placing the first lead frame into each opening of said auxiliary lead frame to form an assembly such that the resin leakage preventing members are placed in planar gaps between the outer leads to prevent molding resin from leaking through gaps in the inner leads while molding the package;
   placing the assembly in the die cavity between the mold dies;
   aligning the assembly such that the mold die projections extend into spacings between the spaced leads;
   clamping the assembly between the mold dies such that an overlapping part of said first lead frame is placed between adjacent ones of said depressions; and
   injecting a molding resin into the die cavity such that the molding resin is substantially prevented from leaking out from the mold dies.

8. The method according to claim 7, wherein said first lead frame and said auxiliary lead frame are simultaneously clamped by the top and bottom mold dies after placing said first lead frame onto each opening of the auxiliary lead frame.

9. The method according to claim 7, wherein said auxiliary lead frame is provided with a plurality of holes and said bottom mold die is provided with a plurality of fixing pins at positions corresponding to said holes, and including the further step of inserting said fixing pins into said holes thus fixing the auxiliary lead frame to the bottom mold die.

10. The method according to claim 7, wherein said bottom mold die is provided with fixing pins, while said auxiliary lead frame is provided with holes, and further including the step of coupling said fixing pins to said holes so as to fix the auxiliary lead frame to the bottom mold die.

11. The method according to claim 7, wherein said auxiliary lead frame has a plurality of resin leakage preventing members formed about each of said openings, and further including the step of locating said members between the spaced outer leads of the first lead frame for preventing resin from leaking out of the mold dies during the injecting step.

* * * * *